(12) United States Patent
Ma et al.

(10) Patent No.: US 10,806,061 B2
(45) Date of Patent: Oct. 13, 2020

(54) CONTROL METHOD AND APPARATUS FOR SMART POWER COMPONENT, STORAGE MEDIUM AND PROCESSOR

(71) Applicants: Gree Electric Appliances (Wuhan) Co., Ltd, Wuhan, Hubei (CN); Gree Electric Appliances, Inc. of Zhuhai, Zhuhai, Guangdong (CN)

(72) Inventors: Jinpeng Ma, Guangdong (CN); Biao Dai, Guangdong (CN); Yaqi Zhu, Guangdong (CN); Haisong Cheng, Guangdong (CN)

(73) Assignees: Gree Electric Appliances (Wuhan) Co., Ltd, Wuhan (CN); Gree Electric Appliances, Inc. of Zhuhai, Zhuhai (CN)

( * ) Notice: Subject to any disclaimer, the term of this patent is extended or adjusted under 35 U.S.C. 154(b) by 0 days.

(21) Appl. No.: 16/627,633

(22) PCT Filed: Aug. 8, 2018

(86) PCT No.: PCT/CN2018/099435
§ 371 (c)(1),
(2) Date: Dec. 30, 2019

(87) PCT Pub. No.: WO2019/095740
PCT Pub. Date: May 23, 2019

(65) Prior Publication Data
US 2020/0275592 A1    Aug. 27, 2020

(30) Foreign Application Priority Data
Nov. 20, 2017  (CN) .......................... 2017 1 1171425

(51) Int. Cl.
*H05K 13/08*    (2006.01)
*G08B 21/18*    (2006.01)
(Continued)

(52) U.S. Cl.
CPC ............. *H05K 13/082* (2018.08); *G01B 7/16* (2013.01); *G08B 21/18* (2013.01); *H05K 7/2039* (2013.01)

(58) Field of Classification Search
None
See application file for complete search history.

(56) References Cited

U.S. PATENT DOCUMENTS 4,444,994 A * 4/1984 Baker .................. H05K 7/2039
165/80.3
6,808,243 B1 * 10/2004 Markham ............ B41J 2/04563
347/14
(Continued)

FOREIGN PATENT DOCUMENTS

CN      102232244 A    11/2011
CN      106211703 A    12/2016
(Continued)

OTHER PUBLICATIONS

International Search Report, dated Sep. 29, 2018, in International application No. PCT/CN2018/099435, filed on Aug. 8, 2018.

*Primary Examiner* — Fekadeselassie Girma
(74) *Attorney, Agent, or Firm* — McAndrews, Held & Malloy, Ltd.

(57) ABSTRACT

A control method and apparatus for a smart power component, a storage medium and a processor are provided. The method includes that: first fitting information and second fitting information, which is detected by the smart power component, between a smart power component and an external heat sink is acquired; it is determined whether the first fitting information satisfies a preset condition, and it is determined whether the second fitting information satisfies a preset condition; when the first fitting information does not satisfy the preset condition, first prompt information is output; and when the second fitting information does not
(Continued)

satisfy the preset condition, second prompt information is output. Thus, the technical problem that a poor fit between a smart power component and an external heat sink is not detected is solved.

11 Claims, 2 Drawing Sheets

(51) Int. Cl.
*G01B 7/16* (2006.01)
*H05K 7/20* (2006.01)

(56) References Cited

U.S. PATENT DOCUMENTS

| | | | | |
|---|---|---|---|---|
| 7,471,517 | B1* | 12/2008 | Desrosiers | H01L 23/4006 165/185 |
| 7,474,532 | B1* | 1/2009 | Desrosiers | H01L 23/4006 165/185 |
| 9,265,181 | B2* | 2/2016 | Tang | H05K 7/20781 |
| 9,867,317 | B1* | 1/2018 | Jetton | H05K 7/209 |
| 10,741,107 | B2* | 8/2020 | Hall | H05K 5/0256 |
| 2008/0144289 | A1* | 6/2008 | Desrosiers | G01R 1/0458 361/719 |
| 2008/0192427 | A1* | 8/2008 | Wu | H01L 23/427 361/679.52 |
| 2010/0052495 | A1* | 3/2010 | Liu | F21V 15/01 313/46 |
| 2010/0157540 | A1* | 6/2010 | Yu | H01L 23/433 361/710 |
| 2010/0187046 | A1* | 7/2010 | Stolt | H02P 29/02 187/293 |
| 2012/0307484 | A1* | 12/2012 | Lin | F21V 29/763 362/184 |
| 2013/0088871 | A1* | 4/2013 | Yun | F21V 29/51 362/249.01 |
| 2014/0160671 | A1* | 6/2014 | Yang | G06F 1/203 361/679.47 |
| 2014/0176272 | A1* | 6/2014 | Frank | H01F 27/06 336/61 |
| 2015/0170819 | A1* | 6/2015 | Yamashima | H01F 27/22 336/61 |
| 2015/0173148 | A1* | 6/2015 | Casper | H05B 45/14 315/152 |
| 2015/0182375 | A1* | 7/2015 | Binversie | A61F 7/007 601/18 |
| 2015/0214642 | A1* | 7/2015 | Majcher | H05K 7/20254 439/65 |
| 2016/0061532 | A1* | 3/2016 | Espersen | F28D 15/025 165/104.21 |
| 2016/0120071 | A1* | 4/2016 | Shedd | F25B 23/006 361/679.47 |
| 2016/0299545 | A1* | 10/2016 | May | G06F 1/20 |
| 2016/0381823 | A1* | 12/2016 | Ye | H05K 1/181 361/736 |
| 2017/0064865 | A1* | 3/2017 | Kuwahara | H05K 7/20154 |
| 2017/0288565 | A1* | 10/2017 | Bethke | H05K 5/0217 |
| 2017/0371384 | A1* | 12/2017 | Ingalls | G06F 1/183 |
| 2018/0376613 | A1* | 12/2018 | Chida | H05K 7/2049 |
| 2019/0307013 | A1* | 10/2019 | Hashizume | H05K 7/1422 |
| 2020/0113086 | A1* | 4/2020 | Fackler | F28D 15/0275 |
| 2020/0209935 | A1* | 7/2020 | Har-Shai | H02H 3/24 |

FOREIGN PATENT DOCUMENTS

| | | | |
|---|---|---|---|
| CN | 107062977 A | 8/2017 | |
| CN | 108107055 A | 6/2018 | |
| GB | 986031 A | 3/1965 | |
| JP | 2010056116 A | 3/2010 | |
| WO | WO-2009043965 A1 * | 4/2009 | ............ H02P 29/02 |
| WO | WO-2009125506 A1 * | 10/2009 | ............ H02K 11/33 |
| WO | WO-2012101734 A1 * | 8/2012 | ............ G06F 30/20 |
| WO | WO-2013157357 A1 * | 10/2013 | ............ H05B 1/0236 |
| WO | WO-2014001479 A1 * | 1/2014 | ............ G01D 5/202 |
| WO | WO-2014162773 A1 * | 10/2014 | ............ A47L 9/2884 |
| WO | WO-2018038486 A1 * | 3/2018 | ............ B29C 64/245 |

* cited by examiner

CONTROL METHOD AND APPARATUS FOR SMART POWER COMPONENT, STORAGE MEDIUM AND PROCESSOR

CROSS-REFERENCE TO RELATED APPLICATIONS

This application is a 371 of International Patent Application No. PCT/CN2018/099435, filed Aug. 8, 2018, which claims benefit of Chinese Patent Application No. 201711171425.9, filed to the China Patent Office on Nov. 20, 2017. Contents of both of which are hereby incorporated by reference in their entirety.

TECHNICAL FIELD

The present disclosure relates to the control field, in particular to a control method and apparatus for a smart power component, a storage medium, and a processor.

BACKGROUND

A smart power component is used more and more widely now. Since the smart power component is self-heating during a working process, and the smart power component does not fit well with an external heat sink, a temperature of the smart power component rises too high and even the smart power component burns out. And when the smart power component fits too tight with the external heat sink, a stress generates on the smart power component and an internal chip of the smart power component to cause failures, so a fitting between the smart power component and the external heat sink is very important for the safe and stable operation of the smart power component. However, there is no method known to the inventors to detect whether the fit between the smart power component and the external heat sink is poor.

As to the above-mentioned problem, no effective solution has been provided yet.

SUMMARY

At least some embodiments of the present disclosure provide a control method and apparatus for a smart power component, a storage medium and a processor, so as at least to partially solve a technical problem that a poor fit between a smart power component and an external heat sink is not detected.

In an embodiment of the present disclosure, a control method for a smart power component is provided, which may include that: first fitting information and second fitting information, which is detected by the smart power component, between a smart power component and an external heat sink is acquired, the first fitting information being the fitting information around a fixed point of the smart power component, and the second fitting information being the fitting information around a non-fixed point of the smart power component; it is determined whether the first fitting information satisfies a preset condition, and it is determined whether the second fitting information satisfies the preset condition; when the first fitting information does not satisfy the preset condition, first prompt information is output, the first prompt information being used for prompting to adjust a fitting around the fixed point; and when the second fitting information does not satisfy the preset condition, second prompt information is output, the second prompt information being used for prompting to adjust a fitting around the non-fixed point.

In some embodiments, the operation that it is determined whether the first fitting information satisfies the preset condition, and it is determined whether the second fitting information satisfies the preset condition may include that: it is determined whether the first fitting information satisfies the preset condition, and then, when the first fitting information satisfies the preset condition, it is determined whether the second fitting information satisfies the preset condition.

In some embodiments, the operation that the first fitting information and the second fitting information, which is detected by the smart power component, between the smart power component and the external heat sink is acquired may include that: an analog signal which is output through a pin of the smart power component is acquired, the analog signal including a voltage signal or a current signal, and the analog signal being used for representing the first fitting information and the second fitting information; and the analog signal is converted to a digital signal to obtain the first fitting information and the second fitting information.

In some embodiments, before the analog signal which is output by the smart power component through the pin is acquired, the control method may further include that: a deformation quantity of a contact surface between the smart power component and the external heat sink is detected through a stress measuring sensor integrated in the smart power component; the detected deformation quantity is converted to the analog signal.

In some embodiments, after it is determined whether the first fitting information satisfies the preset condition, and it is determined whether the second fitting information satisfies the preset condition, the control method may further include that: when determining that the first fitting information satisfies the preset condition, and the second fitting information satisfies the preset condition, it is determined that the fit between the smart power component and the external heat sink is normal.

In another embodiment of the present disclosure, a control apparatus for a smart power component is also provided, which may include: an acquiring element, configured to acquire the first fitting information and the second fitting information, which is detected by the smart power component, between the smart power component and the external heat sink, the first fitting information being the fitting information around the fixed point of the smart power component, and the second fitting information being the fitting information around the non-fixed point of the smart power component; a determining element, configured to determine whether the first fitting information satisfies a preset condition, and determine whether the second fitting information satisfies the preset condition; a first outputting element, configured to output the first prompt information when the first fitting information does not satisfy the preset condition, the first prompt information being used for prompting to adjust a fitting around the fixed point; and a second outputting element, configured to output the second prompt information when the second fitting information does not satisfy the preset condition, the second prompt information being used for prompting to adjust a fitting around the non-fixed point.

In some embodiments, the determining element is further configured to determine whether the first fitting information satisfies the preset condition, and then, when the first fitting information satisfies the preset condition, determine whether the second fitting information satisfies the preset condition.

In some embodiments, the acquiring element includes: an acquiring component, configured to acquire the analog signal which is output through the pin of the smart power component, the analog signal including the voltage signal or the current signal, and the analog signal being used for representing the first fitting information and the second fitting information; and a converting component, configured to convert the analog signal to the digital signal to obtain the first fitting information and the second fitting information.

In some embodiments, the control apparatus may further include: a determining component, configured to determine that the fit between the smart power component and the external heat sink is normal when determining that the first fitting information satisfies the preset condition, and the second fitting information satisfies the preset condition.

In another embodiment of the present disclosure, a storage medium is also provided. The storage medium includes a stored program. The stored program is configured to perform, when running, the control method for a smart power component as mentioned above.

In another embodiment of the present disclosure, a processor is also provided, configured to run a program. The program is configured to perform, when running, the control method for a smart power component as mentioned above.

In the at least some embodiments, the deformation quantity of the contact surface between the smart power component and the external heat sink is detected by integrating the stress measuring sensor in the smart power component, to determine whether the fit between the smart power component and the external heat sink is normal, and when the fit is not normal, prompt information is output to adjust the fit between the smart power component and the external heat sink. Thus, the technical problem known to the inventors that a poor fit between the smart power component and the external heat sink is not detected is solved, and the technical effect of making the fit between the smart power component and the external heat sink normal is achieved.

BRIEF DESCRIPTION OF THE DRAWINGS

The accompanying drawings described here are used for providing further understanding of the present disclosure, and constitute a part of the present disclosure. Schematic embodiments of the present disclosure and description thereof are used for illustrating the present disclosure and not intended to form an improper limit to the present disclosure. In the accompanying drawings.

DETAILED DESCRIPTION

In order to make those skilled in the art understand the solutions of the present disclosure better, technical solutions in embodiments of the present disclosure are clearly and completely elaborated below in combination with the accompanying drawings. It is apparent that the described embodiments are a part of the embodiments of the present disclosure but not all. On the basis of the embodiment of the present disclosure, all other embodiments obtained on the premise of no creative work of those skilled in the art should fall within the protection scope of the present disclosure.

It should be noted that the specification and claims of the application and terms "first", "second", etc. in the foregoing drawings are used for distinguishing similar objects rather than describing a specific sequence or a precedence order. It should be understood that the objects may be exchanged under appropriate circumstances, so that the embodiments of the present disclosure described here may be implemented in an order different from that described or shown here. In addition, terms "include" and "have" and any variations thereof are intended to cover non-exclusive inclusions. For example, it is not limited for processes, methods, systems, products or devices containing a series of steps or elements to clearly list those steps or elements, and other steps or elements which are not clearly listed or are inherent to these processes, methods, products or devices may be included instead.

In an embodiment of the present disclosure, a method embodiment of a control method for a smart power component is provided. It is to be noted that these steps presented in the flowchart of the accompanying drawings can be executed in a computer system like a group of computer executable instructions, and moreover, although a logical sequence is shown in the flowchart, in some cases, the presented or described steps can be performed in a sequence different from that described here.

Figure 1:
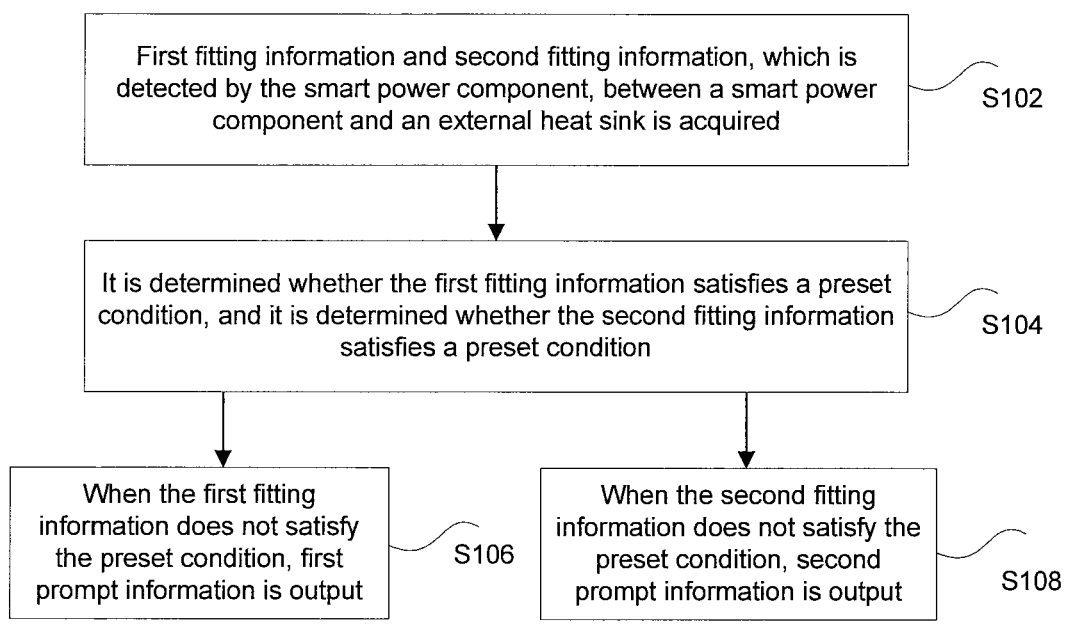
FIG. 1 is a flowchart of a control method for a smart power component according to an embodiment of the present disclosure.

FIG. 1 is a flowchart of a control method for a smart power component according to an embodiment of the present disclosure. As shown in FIG. 1, the method may include the following steps.

At step 102, first fitting information and second fitting information, which is detected by the smart power component, between a smart power component and an external heat sink is acquired. The first fitting information is the fitting information around a fixed point of the smart power component, and the second fitting information is the fitting information around a non-fixed point of the smart power component.

Figure 2:
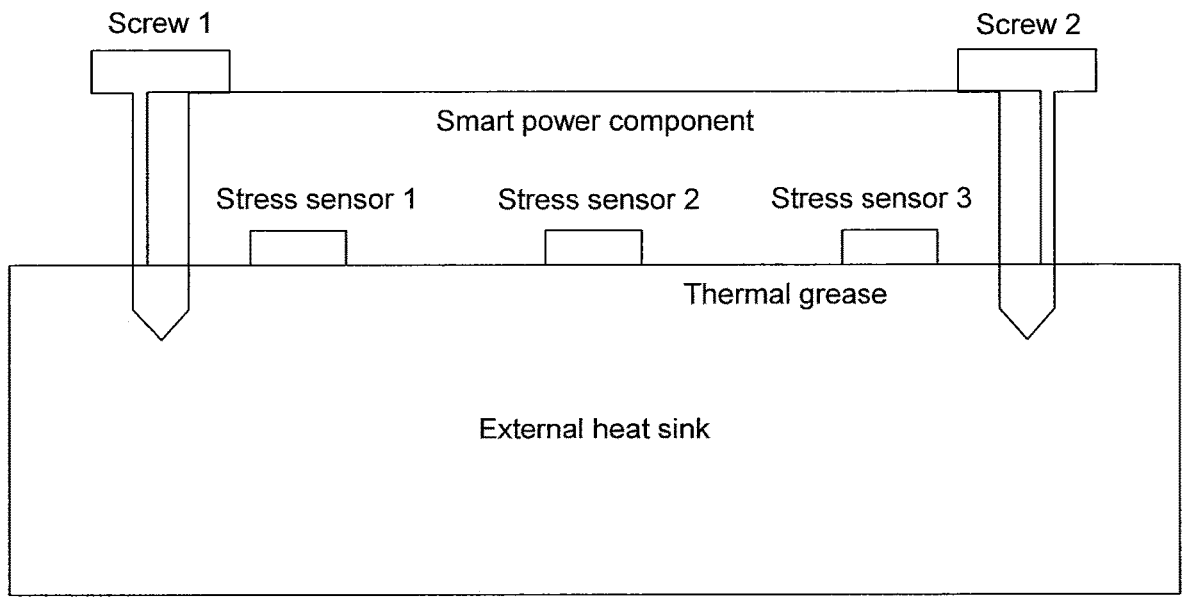
FIG. 2 is a schematic diagram illustrating a fit between a smart power component and an external heat sink according to an embodiment of the present disclosure.

Since the smart power component is self-heating during a working process, and the smart power component does not fit well with the external heat sink, a temperature of the smart power component rises too high and even the smart power component burns out. When the component fits too tight with the external heat sink, a stress generates on the smart power component and an internal chip of the smart power component to cause failures; thus a fitting between the smart power component and the external heat sink is very important for the safe and stable operation of the smart power component. FIG. 2 is a schematic diagram illustrating a fit between a smart power component and an external heat sink according to an embodiment of the present disclosure. As shown in FIG. 2, the smart power component fits with the external heat sink.

A stress measuring sensor made of a stress sensitive material is integrated in the smart power component, and the fitting information is detected though the stress measuring sensor. There are multiple sensors arranged at different positions of the smart power component, including sensors arranged around the fixed point, and sensors arranged around the non-fixed point. For example, FIG. 2 shows that there is a sensor (namely stress sensor 1 near screw 1 or stress sensor 3 near screw 2) around each fastening screw (namely screw 1 or screw 2), and there is a sensor (namely stress sensor 2) arranged between two fastening screws. The sensor around the fastening screw detects the first fitting information, and the sensor between two screws detects the second fitting information. The first fitting information represents whether the fastening screw is too tight or too loose, and the second fitting information represents whether a fit surface between the smart power component and the external heat sink is smooth.

The stress measuring sensor integrated in the smart power component detects a deformation quantity of a contact surface between the smart power component and the external heat sink, converts the detected deformation quantity to an analog signal, and outputs the analog signal through a pin of the smart power component. The smart power component outputs the acquired analog signal to a controller, and then the controller determines whether the fitting information represented by the analog signal satisfies a set condition.

The smart power component outputs the analog signal to the controller through the pin of this smart power component. A form of the analog signal is a voltage signal or a current signal. The controller acquires the voltage signal or the current signal, and converts the voltage signal or the current signal to a digital signal, so that the first fitting information and the second fitting information is acquired. That is, the controller acquires the deformation quantity of the contract surface between the smart power component and the external heat sink.

At step 104, it is determined whether the first fitting information satisfies a preset condition, and it is determined whether the second fitting information satisfies a preset condition.

When the fitting information indicates that the fit between the smart power component and the external heat sink is not normal, the fitting between the smart power component and the external heat sink needed to be adjusted. In some embodiments, it is determined whether the first fitting information satisfies the set condition, and then, when the first fitting information satisfies the preset condition, it is determined whether the second fitting information satisfies the preset condition. That is, when the first fitting information does not satisfy the preset condition, the fitting near the fixed point of the smart power component and the external heat sink is adjusted, and after the fitting near the fixed point of the smart power component and the external heat sink satisfies the set condition, the fitting between the smart power component and the external heat sink is adjusted, so that the fitting between the fixed points satisfies the set condition.

At step 106, when the first fitting information does not satisfy the preset condition, first prompt information is output. The first prompt information is used for prompting to adjust the fitting around the fixed point.

At step 108, when the second fitting information does not satisfy the preset condition, second prompt information is output. The second prompt information is used for prompting to adjust the fitting around the non-fixed point.

The first fitting information and the second fitting information are represented by values, and the preset conditions are thresholds. The preset conditions include a too loose threshold and a too tight threshold. When the first fitting information is greater than the too tight threshold, a prompt warning too tight fit is output. When the first fitting information is less than the too loose threshold, a prompt warning too loose fit is output. When the first fitting information satisfies the preset condition, and the second fitting information is between the too loose threshold and the too tight threshold, it is determined that the fitting between the smart power component and the external heat sink is normal.

When the second fitting information is not between the too loose threshold and the too tight threshold, it is prompted that the fitting between the smart power component and the external heat sink is to be adjusted. That is, when it is determined that the first fitting information satisfies the preset condition, and the second fitting information satisfies the preset condition, it is determined that the fit between the smart power component and the external heat sink is normal.

In some embodiments, the deformation quantity of the contact surface between the smart power component and the external heat sink is detected by integrating the stress measuring sensor in the smart power component, to determine whether the fit between the smart power component and the external heat sink is normal. When the fit is not normal, prompt information is output to adjust the fit between the smart power component and the external heat sink. Thus, the technical problem known to the inventors that a poor fit between the smart power component and the external heat sink is not detected is solved, and the technical effect of making the fit between the smart power component and the external heat sink normal is achieved.

The control method for the smart power component may include the following steps.

At step 301, information of multiple stress sensors is acquired.

At step 302, a too tight threshold and a too loose threshold are set.

At step 303, it is determined whether the sensor near the fixed point is greater than the too tight threshold; when the determination result is yes, S304 is performed; when the determination result is no, S305 is performed.

At step 304, an alarm of too tight fit of the fixed points is performed.

At step 305, it is determined whether the sensor near the fixed point is less than the too loose threshold; when the determination result is yes, S306 is performed; when the determination result is no, S307 is performed.

At step 306, an alarm of too loose tight of the fixed points is performed.

At step 307, it is determined whether the sensor near the fixed point is not in a threshold range; when the determination result is yes, S308 is performed; when the determination result is no, S309 is performed.

At step 308, an alarm of unsmooth fit surface is performed.

At step 309, the fit is normal.

That is, in some embodiments, one too tight threshold and one too loose threshold are set, when the fitting near the fixed point is greater than the too tight threshold, an alarm of too tight fit is output, and the fit tightness is adjusted. When the fitting near the fixed point is less than the too loose threshold, an alarm of too loose fit is output, and the fit tightness is adjusted. When the fitting near the fixed point is between the too loose threshold and the too tight threshold, and the fitting near the non-fixed point is not in the threshold range, an alarm of unsmooth fit surface is output. And when all the fittings are in the threshold range, the fit is normal.

Figure 3:
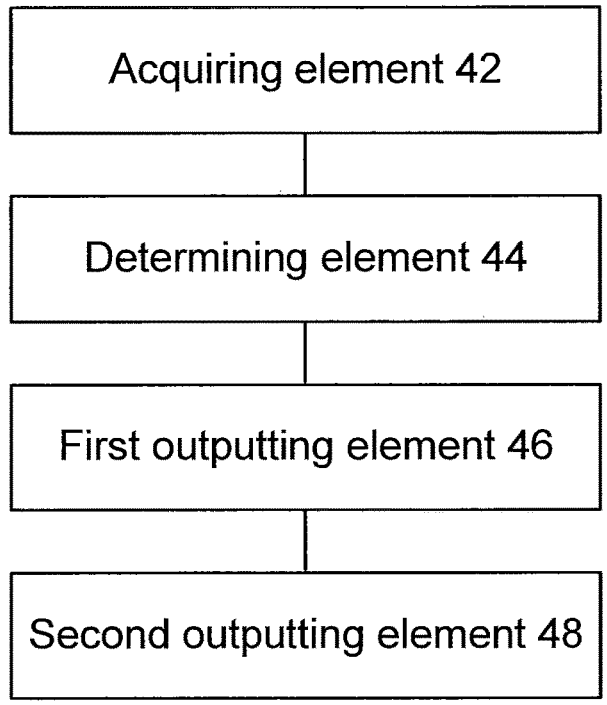
FIG. 3 is a schematic diagram of a control apparatus for a smart power component according to an embodiment of the present disclosure.

Another embodiment of the present disclosure also provides a control apparatus for a smart power component. FIG. 3 is a schematic diagram of a control apparatus for a smart power component according to an embodiment of the present disclosure. As shown in FIG. 3, the control apparatus for a smart power component may include:

an acquiring component 42, configured to acquire the first fitting information and the second fitting information, which is detected by the smart power component, between the smart power component and the external heat sink. The first fitting information is the fitting information around the fixed point of the smart power component, and the second fitting information is the fitting information around the non-fixed point of the smart power component.

Since the smart power component is self-heating during a working process, and the smart power component does not fit well with the external heat sink, a temperature of the smart power component rises too high and even the smart power component burns out. When the component fits too tight with the external heat sink, a stress generates on the smart power component and an internal chip of the smart power component to cause failures; thus the fitting between the smart power component and the external heat sink is very important for the safe and stable operation of the smart power component. FIG. 2 is a schematic diagram illustrating a fit between a smart power component and an external heat sink according to an embodiment of the present disclosure. As shown in FIG. 2, the smart power component fits with the external heat sink.

A stress measuring sensor made of a stress sensitive material is integrated in the smart power component, and the fitting information is detected though the stress measuring sensor. There are multiple sensors arranged at different positions of the smart power component, including the sensors arranged around the fixed point, and the sensors arranged around the non-fixed point. For example, FIG. 2 shows that there is a sensor around each fastening screw, and there is a sensor arranged between two fastening screws. The sensor around the fastening screw detects the first fitting information, and the sensor between two screws detects the second fitting information. The first fitting information represents whether the fastening screw is too tight or too loose, and the second fitting information represents whether the fit surface between the smart power component and the external heat sink is smooth.

The stress measuring sensor integrated in the smart power component detects the deformation quantity of the contact surface between the smart power component and the external heat sink, converts the detected deformation quantity to the analog signal, and outputs the analog signal through the pin of the smart power component. The smart power component outputs the acquired analog signal to the controller, and then the controller determines whether the fitting information represented by the analog signal satisfies the set condition.

The smart power component outputs the analog signal to the controller through the pin of this smart power component. A form of the analog signal is the voltage signal or the current signal. The controller acquires the voltage signal or the current signal, and converts the voltage signal or the current signal to the digital signal, so that the first fitting information and the second fitting information are acquired. That is, the controller acquires the deformation quantity of the contract surface between the smart power component and the external heat sink.

That is, the acquiring element includes: an acquiring component, configured to acquire the analog signal which is output through a pin of the smart power component, the analog signal including the voltage signal or the current signal, and the analog signal being used for representing the first fitting information and the second fitting information; and a converting component, configured to convert the analog signal to the digital signal to obtain the first fitting information and the second fitting information.

A determining element 44 is configured to determine whether the first fitting information satisfies the preset condition, and determine determined whether the second fitting information satisfies the preset condition.

When the fitting information indicates that the fit between the smart power component and the external heat sink is not normal, the fitting between the smart power component and the external heat sink needed to be adjusted. In some embodiments, it is determined whether the first fitting information satisfies the set condition, and then, when the first fitting information satisfies the preset condition, it is determined whether the second fitting information satisfies the preset condition. That is, when the first fitting information does not satisfy the preset condition, the fitting near the fixed point of the smart power component and the external heat sink is adjusted, and after the fitting near the fixed point of the smart power component and the external heat sink satisfies the set condition, the fitting between the smart power component and the external heat sink is adjusted, so that the fitting between the fixed points satisfies the set condition.

A first outputting element 46 is configured to output the first prompt information when the first fitting information does not satisfy the preset condition. The first prompt information is used for prompting to adjust the fitting around the fixed point.

A second outputting element 48 is configured to output the second prompt information when the second fitting information does not satisfy the preset condition. The second prompt information is used for prompting to adjust the fitting around the non-fixed point.

The first fitting information and the second fitting information is represented by values, and the preset conditions are thresholds. The preset conditions include the too loose threshold and the too tight threshold. When the first fitting information is greater than the too tight threshold, the prompt warning too tight fit is output. When the first fitting information is less than the too loose threshold, the prompt warning too loose fit is output. When the first fitting information satisfies the preset condition, and the second fitting information is between the too loose threshold and the too tight threshold, it is determined that the fitting between the smart power component and the external heat sink is normal. When the second fitting information is not between the too loose threshold and the too tight threshold, it is prompted that the fitting between the smart power component and the external heat sink is to be adjusted. That is, the determining component is configured to determine that the fit between the smart power component and the external heat sink is normal when it is determined that the first fitting information satisfies the preset condition, and the second fitting information satisfies the preset condition.

In some embodiments, the deformation quantity of the contact surface between the smart power component and the external heat sink is detected by integrating the stress measuring sensor in the smart power component, to determine whether the fit between the smart power component and the external heat sink is normal. When the fit is not normal, prompt information is output to adjust the fit between the smart power component and the external heat sink. Thus, the technical problem known to the inventors that the poor fit between the smart power component and the external heat sink is not detected is solved, and the technical effect of making the fit between the smart power component and the external heat sink normal is achieved.

Another embodiment of the present disclosure also provides a storage medium. The storage medium includes a stored program. The stored program is configured to perform, when running, the control method for a smart power component in embodiments as mentioned above.

Another embodiment of the present disclosure also provides a processor. The processor is used for running a program. The program is configured to perform, when running, the control method for a smart power component in embodiments as mentioned above.

In the above embodiments of the present disclosure, descriptions of the embodiments focus on different aspects. A part which is not described in a certain embodiment in detail may refer to the related description of the other embodiments.

In the several embodiments provided in the application, it should be understood that the technical contents disclosed may be realized in other ways. The embodiment of the apparatus described above is schematic; for example, the division of the elements is a division of logical functions, and there may be other dividing modes during the actual implementation, for example, multiple elements or components may be combined or integrated to another system, or some features may be ignored or are not executed. In addition, coupling, direct coupling, or communication connection shown or discussed may be implemented through indirect coupling or communication connection of some interfaces, elements or components, and may be in an electrical form or other forms.

The elements described as separate parts may be or may not be separate physically. The part shown as the element may be or may not be a physical element, that is to say, it may be in a place or distributed on multiple network elements. Some or all of the elements may be selected according to actual needs to achieve the objectives of the solutions of the embodiments.

In addition, functional elements in the embodiments of the present disclosure may be integrated into one processing element, or each of the elements may exist alone physically, or two or more elements are integrated into one element. The integrated element may be realized in form of hardware or in form of software function element.

When the integrated element is implemented by software function components, and the software function components are sold or used as independent products, they can also be stored in a computer readable storage medium. Based on this understanding, the technical solution of the present disclosure substantially or the part making a contribution to the conventional art can be embodied in the form of software product; the computer software product is stored in a storage medium, and includes a number of instructions to make a computer apparatus (which may be a personal computer, a server or a network apparatus, etc.) perform all or part of steps of the method in each embodiment of the present disclosure. The storage media include, but not limited to, a USB flash disk, a Read-Only Memory (ROM), a Random Access Memory (RAM), a mobile hard disk, a magnetic disk, a compact disc, and other media capable of storing the program codes.

The above are exemplary embodiments of the present disclosure; it should be indicated that, on the premise of not departing from the principles of the present disclosure, those of ordinary skill in the art may also make a number of improvements and supplements, and these improvements and supplements should fall within the protection scope of the present disclosure.

INDUSTRIAL APPLICABILITY

To sum up, a control method and apparatus for a smart power component, a storage medium and a processor provided by the embodiments of the present invention have the following beneficial effect: the technical problem that the poor fit between the smart power component and the external heat sink is not detected is solved.

What is claimed is:

1. A control method for a smart power component, comprising:
   acquiring first fitting information and second fitting information, which is detected by the smart power component, between a smart power component and an external heat sink, wherein the first fitting information is fitting information around a fixed point of the smart power component, and the second fitting information is fitting information around a non-fixed point of the smart power component;
   determining whether the first fitting information satisfies a preset condition, and determining whether the second fitting information satisfies the preset condition;
   outputting first prompt information when the first fitting information does not satisfy the preset condition, wherein the first prompt information is used for prompting to adjust a fitting around the fixed point; and
   outputting second prompt information when the second fitting information does not satisfy the preset condition, wherein the second prompt information is used for prompting to adjust a fitting around the non-fixed point.

2. The control method as claimed in claim 1, wherein determining whether the first fitting information satisfies the preset condition, and determining whether the second fitting information satisfies the preset condition comprises:
   determining whether the first fitting information satisfies the preset condition, and then, when the first fitting information satisfies the preset condition, determining whether the second fitting information satisfies the preset condition.

3. The control method as claimed in claim 1, wherein acquiring the first fitting information and the second fitting information, which is detected by the smart power component, between the smart power component and the external heat sink comprises:
   acquiring an analog signal which is output through a pin of the smart power component, wherein the analog signal comprises a voltage signal or a current signal, and the analog signal is used for representing the first fitting information and the second fitting information; and
   converting the analog signal to a digital signal to obtain the first fitting information and the second fitting information.

4. The control method as claimed in claim 3, wherein before acquiring the analog signal which is output through the pin of the smart power component, the method further comprises:
   detecting a deformation quantity of a contact surface between the smart power component and the external heat sink through a stress measuring sensor integrated in the smart power component;
   converting the detected deformation quantity to the analog signal.

5. The control method as claimed in claim 1, wherein after determining whether the first fitting information satisfies the preset condition, and determining whether the second fitting information satisfies the preset condition, the method further comprises:
   when determining that the first fitting information satisfies the preset condition, and the second fitting information satisfies the preset condition, determining that the fit between the smart power component and the external heat sink is normal.

6. A control apparatus for a smart power component, comprising:
an acquiring element, configured to acquire first fitting information and second fitting information, which is detected by the smart power component, between a smart power component and an external heat sink, wherein the first fitting information is the fitting information around a fixed point of the smart power component, and the second fitting information is the fitting information around a non-fixed point of the smart power component;
a determining element, configured to determine whether the first fitting information satisfies a preset condition, and determine whether the second fitting information satisfies the preset condition;
a first outputting element, configured to output first prompt information when the first fitting information does not satisfy the preset condition, wherein the first prompt information is used for prompting to adjust a fitting around the fixed point; and
a second outputting element, configured to output second prompt information when the second fitting information does not satisfy the preset condition, wherein the second prompt information is used for prompting to adjust a fitting around the non-fixed point.

7. The control apparatus as claimed in claim 6, wherein the determining element is further configured to determine whether the first fitting information satisfies the preset condition, and then, when the first fitting information satisfies the preset condition, determine whether the second fitting information satisfies the preset condition.

8. The control apparatus as claimed in claim 6, wherein the acquiring element comprises:
an acquiring component, configured to acquire an analog signal which is output through a pin of the smart power component, wherein the analog signal comprises a voltage signal or a current signal, and the analog signal is used for representing the first fitting information and the second fitting information; and
a converting component, configured to convert the analog signal to a digital signal to obtain the first fitting information and the second fitting information.

9. The control apparatus as claimed in claim 6, further comprising:
a determining component, configured to determine that the fit between the smart power component and the external heat sink is normal when determining that the first fitting information satisfies the preset condition and the second fitting information satisfies the preset condition.

10. A non-transitory storage medium, comprising a stored program; wherein the stored program is configured to perform, when running, a control method for a smart power component as claimed in claim 1.

11. A processor, for running a program; wherein the program is configured to perform, when running, a control method for a smart power component as claimed in claim 1.

* * * * *